(12) United States Patent
Frey et al.

(10) Patent No.: US 9,871,074 B2
(45) Date of Patent: Jan. 16, 2018

(54) METHOD OF FORMING AN INFRARED FILTER ASSOCIATED WITH AN IMAGE SENSOR

(71) Applicant: Commissariat à l'Énergie Atomique et aux Énergies Alternatives, Paris (FR)

(72) Inventors: Laurent Frey, Fontaine (FR); Michel Marty, Saint Paul de Varces (FR); Lilian Masarotto, Fontaine (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 33 days.

(21) Appl. No.: 15/163,557

(22) Filed: May 24, 2016

(65) Prior Publication Data
US 2016/0351617 A1    Dec. 1, 2016

(30) Foreign Application Priority Data

May 28, 2015    (FR) ...................................... 15 54830

(51) Int. Cl.
*H01L 27/00*    (2006.01)
*H01L 27/146*    (2006.01)

(52) U.S. Cl.
CPC .... *H01L 27/14685* (2013.01); *H01L 27/1461* (2013.01); *H01L 27/14621* (2013.01); *H01L 27/14636* (2013.01); *H01L 27/14649* (2013.01); *H01L 27/14689* (2013.01)

(58) Field of Classification Search
CPC ......... H01L 27/14621; H01L 27/14636; H01L 27/14685

USPC .................... 250/208.1, 214.1; 257/432, 459
See application file for complete search history.

(56) References Cited

U.S. PATENT DOCUMENTS

| | | | |
|---|---|---|---|
| 5,398,133 A | 3/1995 | Tsai et al. | |
| 9,601,532 B2 * | 3/2017 | Kanamori | G02B 26/001 |
| 9,658,372 B2 * | 5/2017 | Frey | G01J 1/0437 |
| 2009/0008730 A1 | 1/2009 | Roy et al. | |
| 2009/0298220 A1 | 12/2009 | Anderson et al. | |
| 2012/0085944 A1 | 4/2012 | Gidon et al. | |
| 2015/0041943 A1 | 2/2015 | Frey et al. | |
| 2015/0076735 A1 | 3/2015 | Marty et al. | |

OTHER PUBLICATIONS

French Search Report, dated Mar. 23, 2016, from French Application No. 15/54830.

* cited by examiner

*Primary Examiner* — Kevin Pyo
(74) *Attorney, Agent, or Firm* — Wolf, Greenfield & Sacks, P.C.

(57) ABSTRACT

An image sensor having a portion including interconnection levels formed on a semiconductor substrate covered with a first layer of a dielectric material, including conductive tracks separated from one another by insulating layers interconnected by vias crossing the insulating layers, and an infrared bandpass filter comprising filter levels adjacent to the interconnection levels formed by an alternation of second layers of the dielectric material and of silicon layers, the refraction index of the dielectric material being smaller than 2.5 at the maximum transmission wavelength of the filter, one of the second dielectric layers of each filter level being identical to the insulating layer of the adjacent interconnection level.

18 Claims, 9 Drawing Sheets

METHOD OF FORMING AN INFRARED FILTER ASSOCIATED WITH AN IMAGE SENSOR

CROSS-REFERENCE TO RELATED APPLICATION

This application claims the priority benefit of French patent application number 15/54830, which is hereby incorporated by reference in its entirety to the maximum extent allowable by law.

BACKGROUND

The present disclosure relates to a method of forming an infrared filter associated with an image sensor.

DISCUSSION OF THE RELATED ART

Image sensors formed of a pixel array are here considered.

FIG. 1 schematically shows three pixels of a pixel array of a conventional color image sensor. A semiconductor substrate 10 has pixels of different colors formed thereon, in the shown example, a blue pixel 12B, a green pixel 12G, and a red pixel 12R. Each pixel comprises a photodetection area 14B, 14G, 14R formed in substrate 10. Charge transfer elements 16B, 16G, 16R, in the shown example, MOS transistors, are provided. The photodetection areas are insulated from one another by insulating trenches 18 formed in substrate 10.

Substrate 10 has a stack of interconnection levels comprising metal tracks 20 embedded in an insulating material 22 provided thereabove. Color filters 24B, 24G, 24R are formed at the surface of the stack of interconnection levels and are covered with microlenses 25. Pixels provided with filters selecting a band in the red or near infrared range, particularly in a wavelength range between 600 nm and 1,100 nm are also sometimes provided, for example, for distance measurements between the sensor and an object, in which case the bandwidth should be narrow to suppress the signal originating from the scene.

Further, it is known that interference filters may be obtained by successive depositions of an alternation of dielectric layers having low and high optical indexes. The number of alternated layers and their thicknesses determine the properties of the filter.

As shown in FIG. 2 which corresponds to FIG. 10 of U.S. Pat. No. 5,398,133, an infrared bandpass filter has been formed by the association of a high-pass filter 26 and of a low-pass filter 28. An alternation of layers (26-1 to 26-14) of amorphous silicon (high optical index) and of silicon nitride (low optical index) forms the high-pass filter on a glass substrate 6. An alternation of layers (28-1 to 28-13) of the same materials forms the low-pass filter on glass substrate 6. The thickness of each layer is different. This type of filter has the advantage of having a high transmission and a narrow bandwidth.

Such filters may be deposited at the surface of the interconnection levels of an image sensor, but do not enable to filter a band of the visible range, particularly in a wavelength range between 400 nm and 600 nm, due to the absorption of amorphous silicon. Another disadvantage of the filter described in document U.S. Pat. No. 5,398,133 is that it comprises many layers and has a large total thickness. Another disadvantage is that, if such a filter is deposited at the surface of the interconnection levels of an image sensor, the presence of the filter increases all the more the distance of the microlenses to the silicon substrate. It may then be difficult to obtain an efficient focusing.

SUMMARY

There is a need for an image sensor incorporating filters in infrared and possibly, further, in the visible range, of simple structure.

Thus, an embodiment provides a method of simultaneously forming an infrared bandpass filter on a filter side and interconnection levels on an interconnect side of an image sensor, comprising the steps of:

a) forming a first layer of a dielectric material having a refraction index smaller than 2.5 at the maximum transmission wavelength of the filter on a semiconductor substrate;

b) depositing an etch stop layer;

c) depositing at least one silicon layer having a first thickness;

d) removing, on the interconnect side, said at least one silicon layer;

e) depositing a second layer of the dielectric material having a second thickness greater than the first thickness;

f) forming in the second layer metal tracks and interconnection vias, on the interconnect side;

g) planarizing the surface to a level corresponding to the level of the surface of the second layer, where the second layer does not cover said at least one silicon layer; and h) repeating steps b) to g) at least once, the values of the first and second thicknesses being selected from one repetition to another, according to calculations implying a simulation step and/or according to the desired electric performances.

According to an embodiment, steps a), b), c), d), e), f), g), and h) follow one another.

According to an embodiment, the silicon is amorphous silicon.

According to an embodiment, the dielectric material is silicon oxide.

According to an embodiment, the first and second layers and the silicon layer are deposited at a temperature in the range from 350° C. to 400° C.

According to an embodiment, the first and second layers and the silicon layer are deposited at the same temperature.

According to an embodiment, the method further comprises the step of removing the etch stop layer on the filter side before proceeding to step c).

According to an embodiment, said at least one silicon layer comprises an alternation of amorphous silicon layers and of silicon oxide layers.

According to an embodiment, the etch stop layer is made of silicon nitride, of SiCH, or of SiOCH.

According to an embodiment, the method further comprises forming, before step b), an electric connection with an element of the semiconductor substrate or with a gate of a field-effect transistor formed on the semiconductor substrate.

An embodiment also provides an image sensor having a portion comprising: interconnection levels formed on a semiconductor substrate covered with a first layer of a dielectric material, comprising conductive tracks separated from one another by insulating layers, interconnected by vias crossing the insulating layers; and an infrared bandpass filter comprising filter levels adjacent to the interconnection levels formed by an alternation of second layers of the dielectric material and of silicon layers, the refraction index of the dielectric material being smaller than 2.5 at the maximum transmission wavelength of the filter, one of the second dielectric layers of each filter level being identical to the insulating layer of the adjacent interconnection level.

According to an embodiment, the sensor comprises, at the surface of said portion of the image sensor and opposite the infrared bandpass filter, an alternation of third layers of materials having different optical indexes, adding at least one filter level to the infrared bandpass filter.

According to an embodiment, the sensor further comprises at least one optical filter formed by a resin layer opaque to the wavelengths of the visible range and transparent to infrared wavelengths, arranged at the surface of said portion and opposite the infrared bandpass filter.

According to an embodiment, the sensor comprises at least one optical filter, formed by an alternation of at least partially transparent metal layers and of fourth dielectric layers, arranged at the surface of said portion of the image sensor and opposite the infrared bandpass filter.

According to an embodiment, the sensor further comprises areas dedicated to the visible range comprising color filters arranged at the surface of said portion of the image sensor.

According to an embodiment, the color filters are formed of an alternation of at least partially transparent metal layers and of fifth dielectric layers.

According to an embodiment, the color filters are colored resins.

According to an embodiment, the sensor comprises first and second wafers, each having a front surface and a rear surface, the first wafer comprising on its rear surface a first semiconductor substrate having a first photodetection area sensitive to infrared radiation;

the second wafer comprising on its rear surface a second semiconductor substrate having a second area comprising pixels sensitive to visible radiation and having a third area transparent to the infrared radiation, at least one of the first wafer or of the second wafer comprising on its front surface side a structure comprising the interconnection levels and the filter levels; and the front surface of the first wafer being placed against the front side of the second wafer, to align with the first area the third area, the filter levels, the alignment of said filter levels forming an infrared bandpass filter.

An embodiment also provides a system comprising:

a laser source intended to project an infrared radiation on at least one object; and an image sensor such as previously defined, capable of detecting the radiation reflected by the object.

The foregoing and other features and advantages will be discussed in detail in the following non-limiting description of specific embodiments in connection with the accompanying drawings.

DETAILED DESCRIPTION

Figure 1:
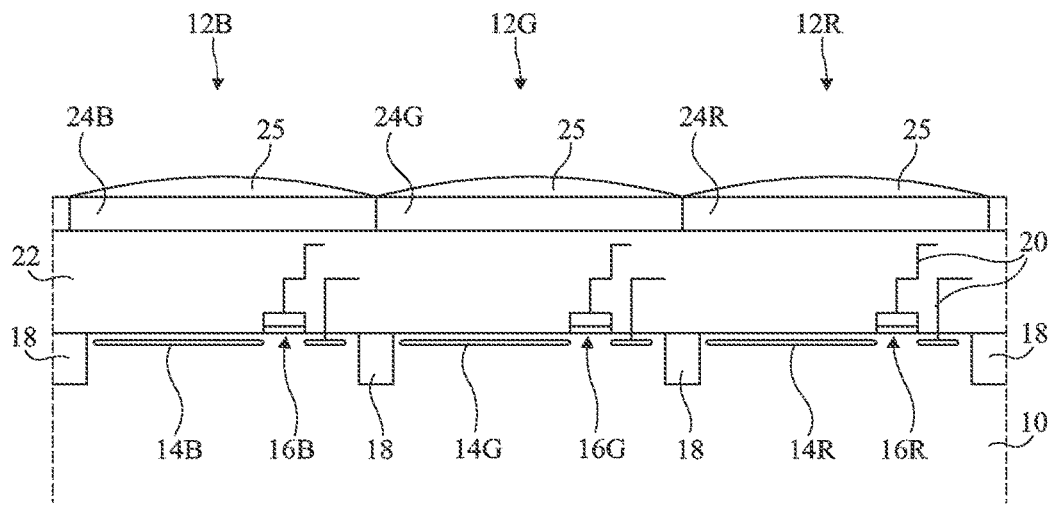
FIG. 1, previously described, illustrates the structure of a conventional color image sensor.
Figure 2:
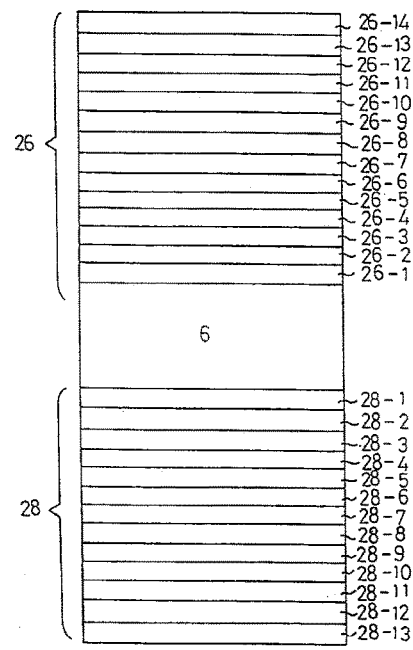
FIG. 2, previously described, is a cross-section view of an infrared interference filter.

The same elements have been designated with the same reference numerals in the different drawings and, further, the various drawings are not to scale. For clarity, only those elements which are useful to the understanding of the described embodiments have been shown and are detailed herein.

In the following description, when reference is made to terms qualifying absolute positions, such as terms "lefthand", "right-hand", or relative positions, such as terms "upper", "lower", or to terms qualifying orientation, such as term "vertical", reference is made to the orientation of the drawings. Unless otherwise specified, words "approximately", "substantially" mean to within 10%, preferably to within 5%.

FIGS. 3A to 3J illustrate steps of a first embodiment of a method of simultaneously manufacturing an alternation of layers forming, on the one hand, interconnection levels (left-hand side of the drawings) and, on the other hand, an infrared filter (right-hand side of the drawings).

This method particularly applies to the case where an image sensor having its structure comprising at least one pixel dedicated to infrared is desired to be formed. The following description will be made in the specific case where a semiconductor substrate 1 has been previously coated with an insulating layer 2, for example, made of silicon oxide ($SiO_2$), where an electric connection 3 with an element of semiconductor substrate 1 or a MOS transistor gate has been prepared.

Figure 3A:
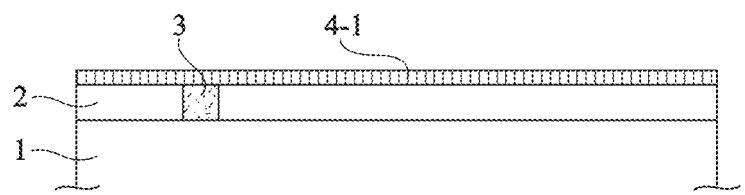
FIGS. 3A to 3J illustrate successive steps of a first embodiment of a method of simultaneously manufacturing interconnection levels and levels of an infrared filter of an image sensor.

In a first step illustrated in FIG. 3A, an etch stop layer 4-1 has been deposited on $SiO_2$ layer 2.

Figure 3B:
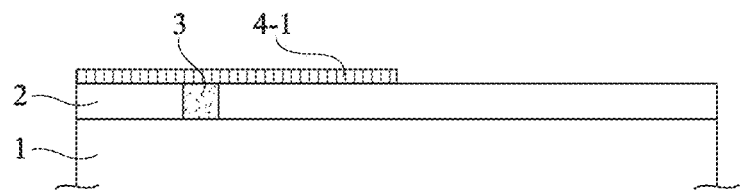

At the step of FIG. 3B, etch stop layer 4-1 has been removed on the right-hand side so that it covers $SiO_2$ layer 2 on the left-hand side only.

Figure 3C:
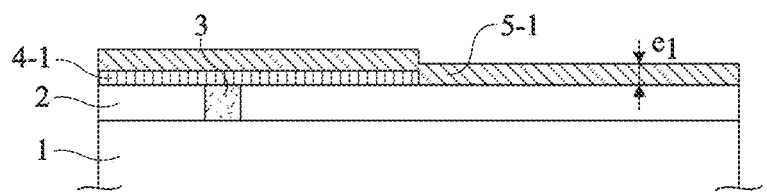

At the step of FIG. 3C, a layer 5-1 of amorphous silicon (α-Si), of thickness e1, has been deposited.

Figure 3D:
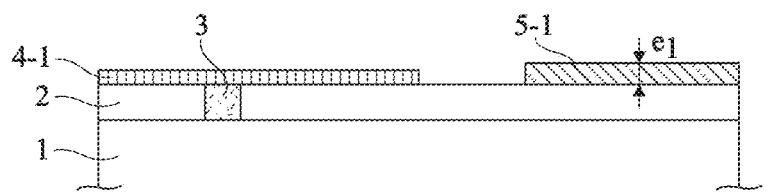

At the step of FIG. 3D, α-Si etch stop layer 5-1 has been removed on the left-hand side so that it covers $SiO_2$ layer 2 on the right-hand side only.

Figure 3E:
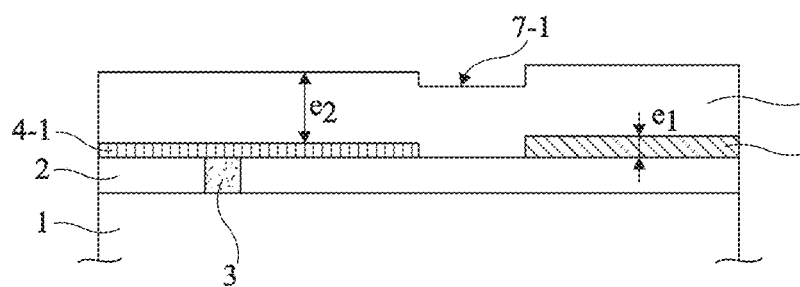

At the step of FIG. 3E, a layer 6-1 of a dielectric material having a low refraction index at the 850-nm wavelength, particularly having a refraction index smaller than 2.5, preferably smaller than 2, of thickness e2 greater than thickness e1, has been deposited. The dielectric material may be $SiO_2$ or a dielectric of low permittivity (low-k), that is, having a relative permittivity smaller than that of $SiO_2$, which is approximately from 3.6 to 850 nm, particularly a mineral-type material based on Si—O, comprising organic materials or hydrides, such as described in patent EP 1109221. Reference 7-1 designates the upper surface of layer 6-1, where layer 6-1 covers none of layers 4-1 and 5-1. In the case where the dielectric material is SiO2, the etch stop layer is for example a silicon nitride layer (SiN). In the case where the dielectric material is a material of low permittivity, the etch stop layer for example is a SiCH or SiOCH layer.

Figure 3F:
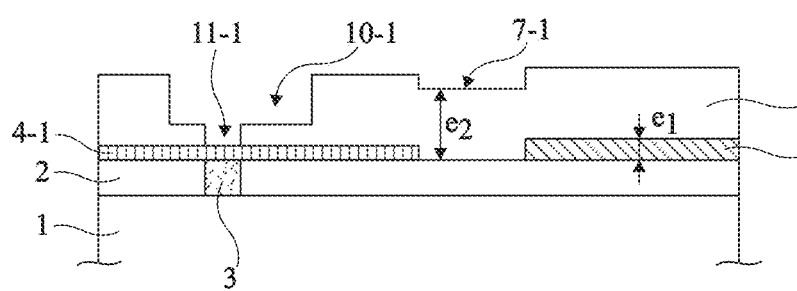

At the step of FIG. 3F, a portion of layer 6-1 of SiO2 forming a recess 10-1 having a depth smaller than e2 has been etched on the left-hand side. Vertically in line with connection 3, a second etching has been performed in recess 10-1 down to etch stop layer 4-1, thus forming a recess 11-1 narrower than recess 10-1. It should be understood that a plurality of recesses of different shapes and sizes may be simultaneously formed.

Figure 3G:
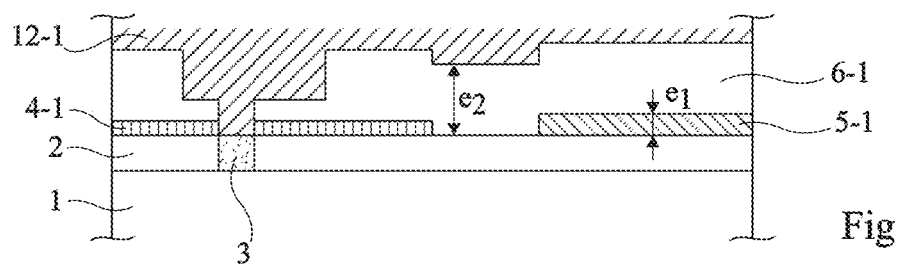

At the step of FIG. 3G, the portion of etch stop layer 4-1 located at the bottom of recess 11-1 has been removed, after which a metal 12-1, for example, copper, coming into contact with connection 3 at the bottom of recess 11-1, has been deposited. Conventionally, this deposition may be preceded by the deposition of diffusion barrier layers (not shown) for example, Ti, Ta, TiN, TaN layers.

Figure 3H:
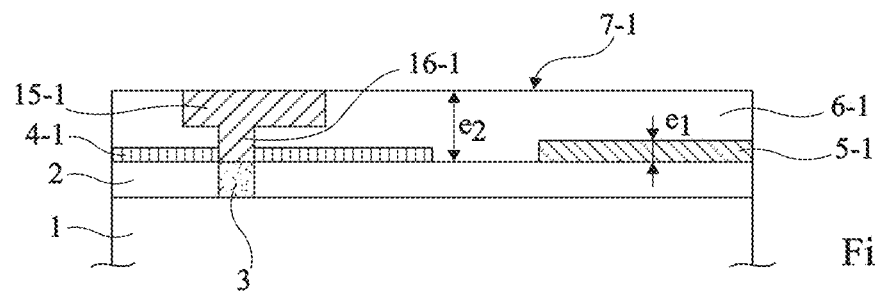

At the step of FIG. 3H, the structure has been planarized to remove all the layers located above surface 7-1. Such a planarization may be carried out, for example, by a chem.-mech. polishing method (CMP). The metal 12-1 remaining in recesses 10-1 and 11-1 respectively form a conductive track 15-1 and a via 16-1 connecting track 15-1 to connection 3.

As a variation, the forming of layer 6-1 of SiO2 may successively comprise depositing a first SiO2 sub-layer, depositing an etch stop layer, for example, made of SiN, and depositing a second SiO2 sub-layer. The total thickness of the first SiO2 sub-layer and of the etch stop layer is equal to the desired thickness of via 16-1 and the thickness of the second SiO2 sub-layer is equal to the thickness of track 15-1. This enables to better control the thicknesses of each SiO$_2$ layer. An example of a method of manufacturing conductive track 15-1 and via 16-1 by a method comprising depositing a plurality of insulating sub-layers is described in patent EP 1109221.

Figure 3I:
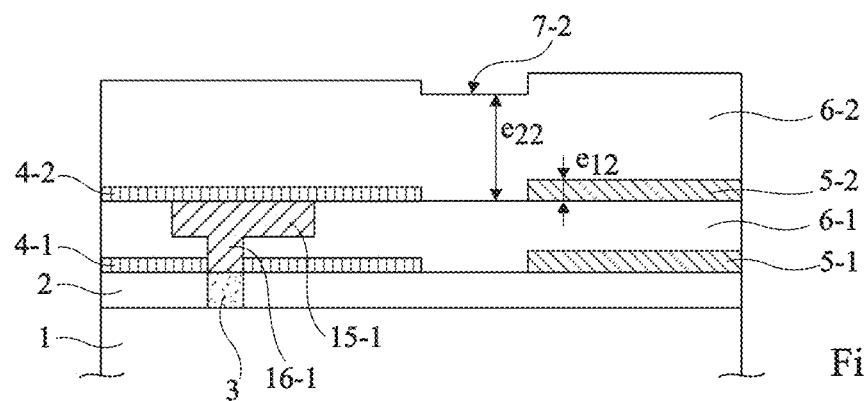

FIG. 3I illustrates a repetition of the succession of steps of FIGS. 3A to 3E, on the structure of FIG. 3H. Thus, the following succession of steps has been carried out:
  depositing an etch stop layer 4-2 on layer 6-1;
  removing etch stop layer 4-2 on the right-hand side;
  depositing a layer 5-2 of α-Si of thickness e12;
  removing layer 5-2 of α-Si on the left-hand side; and
  depositing a layer 6-2 of SiO2 having a thickness e22 greater than thickness e12. Reference 7-2 designates the upper surface of layer 6-2, where layer 6-2 covers none of layers 4-2 and 5-2.

Figure 3J:
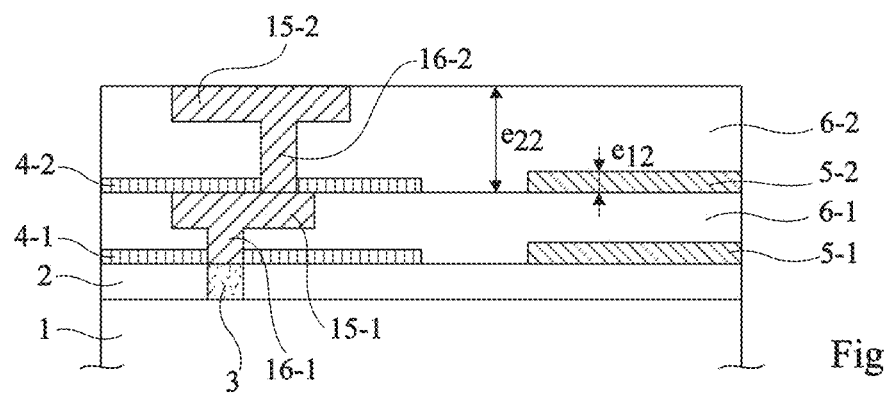

FIG. 3J illustrates the result of the succession of steps of FIGS. 3F to 3H, on the structure of FIG. 3I. Thus, the following succession of steps has been carried out:
  etching in layer 6-2 of SiO2, on the interconnect side, a first recess having a depth smaller than e22;
  etching, inside of the first recess, a second recess in layer 6-2, narrower than the first recess, all the way to etch stop layer 4-2;
  removing the portion of etch stop layer 4-2 located at the bottom of the second recess;
  depositing a metal layer forming, in the recesses, a conductive track 15-2 and a via 16-2 connecting track 15-2 to track 15-1; and
  planarizing the structure at the level of surface 7-2.

A stack of two interconnection levels on the left-hand side of the drawing and a stack of two infrared filter levels have thus been formed on the right-hand side of the drawing by using common steps.

The alternation of layers of SiO2 and of amorphous silicon forms an infrared filter having its filtering properties depending on the number of layers and on their thicknesses.

If a structure having more than two interconnection levels is provided, the process will be repeated and the number of alternated layers of amorphous silicon and of SiO2 will be increased. Optical simulation software is used to determine the thicknesses of the amorphous silicon layers to form infrared filters with the desired properties, according to the SiO2 thicknesses optimized to obtain the desired electric performance, particularly in terms of stray capacitances between levels, according to the interconnection density which can be achieved.

As a variation, if a structure having more than two interconnection levels is provided, an amorphous silicon layer may not be present at each interconnection level.

The inventors have shown that, surprisingly, it is possible to obtain an infrared filter having an adequate spectral response, despite the small number of layers of the infrared filter, and despite the specific constraints due to the fact that the infrared filter is formed simultaneously to interconnection levels, particularly the fact that each layer 6-1, 6-2 of SiO2 has a thickness imposed after the planarization by the desired electric performances of the interconnection levels and that the position of the base of each layer 5-1, 5-2 of α-Si is imposed by the desired electric performances of the interconnection levels.

If insulating layer 2 or insulating layers 6-1, 6-2 had abrupt sides resulting, in particular, from an etching, there would be a risk, on etching of conformally-deposited amorphous silicon layer 5-1, 5-2, for amorphous silicon to remain in unwanted fashion on the abrupt sides of the insulating layer. Advantageously, in the present embodiment, insulating layer 2, 6-1, 6-2 is substantially planar and comprises no abrupt sides.

FIGS. 4A to 4E illustrate steps of a second embodiment of a method of simultaneously manufacturing an alternation of layers forming, on the one hand, an infrared filter and, on the other hand, interconnection levels of an image sensor structure on a semiconductor substrate 1.

Figure 4A:
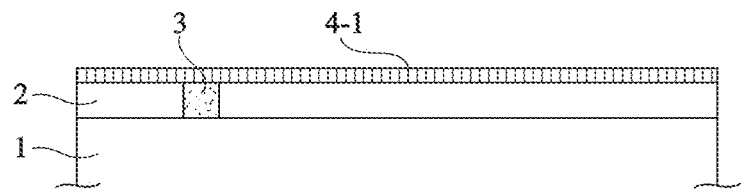
FIGS. 4A to 4E illustrate successive steps of a second embodiment of a method of simultaneously manufacturing interconnection levels and levels of an infrared filter of an image sensor.

As illustrated in FIG. 4A, it is started from a structure identical to that previously described in relation with FIG. 3A.

Figure 4B:
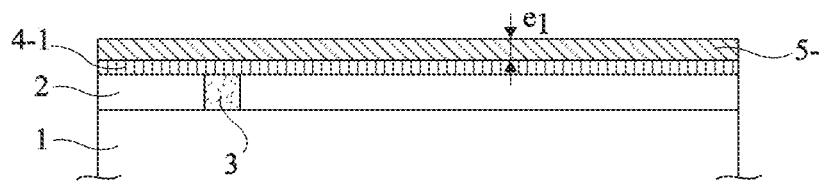

At the step of FIG. 4B, a layer 5-1 of amorphous silicon (α-Si), having a thickness e1, has been deposited on etch stop layer 4-1.

Figure 4C:
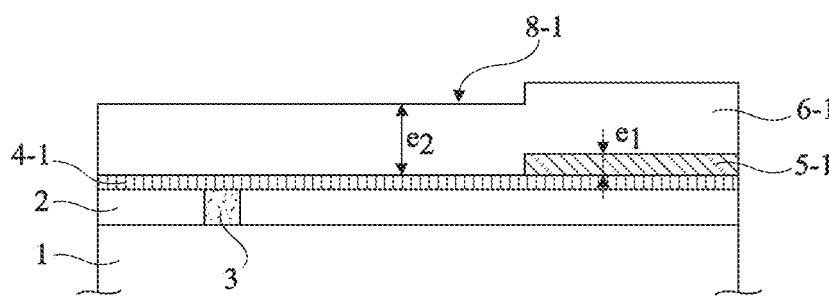

At the step of FIG. 4C, the following succession of steps has been carried out:
  removing by etching layer 5-1 of α-Si on the left-hand side so that it covers etch stop layer 4-1 only on the right-hand side, where the etch stop layer is not etched; and
  depositing a layer 6-1 of SiO2 having a thickness e2 greater than e1.

Reference 8-1 designates the upper surface of layer 6-1, where layer 6-1 does not cover layer 5-1 of α-Si.

Figure 4D:
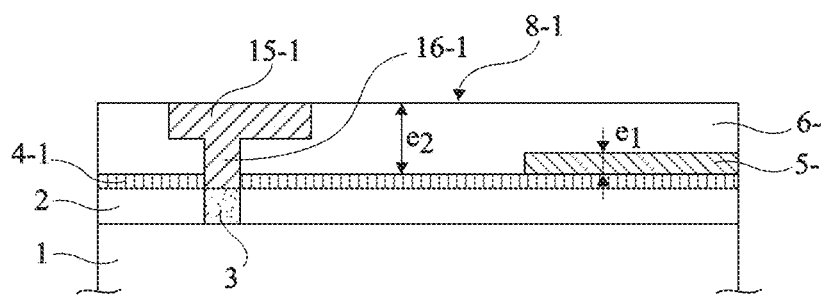

At the step of FIG. 4D, the following succession of steps has been carried out:
  etching in layer 6-1 of SiO2, on the left-hand side, a first recess having a depth smaller than e2;
  etching, inside of the first recess and opposite connection 3, a second recess in layer 6-1, narrower than the first recess, all the way to etch stop layer 4-1;

removing the portion of etch stop layer 4-1 located at the bottom of the second recess;

depositing a metal layer forming, in the recesses, a conductive track 15-1 and a via 16-1 connecting track 15-1 to connection 3; and planarizing the structure at the level of surface 8-1.

Figure 4E:
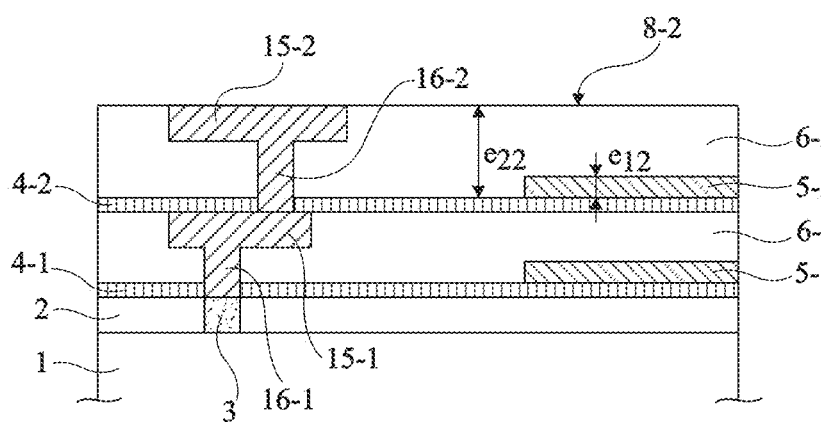

At the step of FIG. 4E, the succession of steps of FIGS. 4A to 4D has been repeated on the structure of FIG. 4D. Thus, the following succession of steps has been carried out:

depositing an etch stop layer 4-2 on SiO2 layer 6-2;

depositing a layer 5-2 of α-Si of thickness e12;

removing layer 5-2 of α-Si on the left-hand side;

depositing a layer 6-2 of SiO2 having a thickness e22 greater than thickness e12. Reference 8-2 designates the upper surface of layer 6-2, where layer 6-2 does not cover layer 5-2 of α-Si;

etching in layer 6-2 of SiO2, on the left-hand side, a first recess having a depth smaller than e22;

etching, inside of the first recess, a second recess in layer 6-2, narrower than the first one, all the way to etch stop layer 4-2;

removing the portion of etch stop layer 4-2 located at the bottom of the second recess;

depositing a metal layer forming, in the recesses, a conductive track 15-2 and a via 16-2 connecting track 15-2 to track 15-1; and planarizing the structure at the level of surface 8-2.

A stack of two interconnection levels on the left-hand side of the drawing and a stack of two infrared filter levels on the right-hand side of the drawing have thus been formed by using common steps.

As in the case of FIGS. 3A to 3J, if more than two interconnection levels are provided, the process will be repeated and the number of alternated amorphous silicon, SiO2, and etch stop layers will be increased. Similarly, simulation software is used to determine the thicknesses of the amorphous silicon layers, according to the thickness of the SiO2 and etch stop layers imposed by the forming of the interconnection levels, to form infrared filters having the desired properties. As in the case of FIGS. 3A to 3J, if a structure having more than two interconnection levels is provided, the presence of an amorphous silicon layer at each interconnection level may not be necessary.

FIGS. 5A to 5E illustrate steps of a third embodiment of a method of simultaneously manufacturing an alternation of layers forming, on the one hand, an infrared filter and, on the other hand, interconnection levels of an image sensor structure on a semiconductor substrate 1.

Figure 5A:
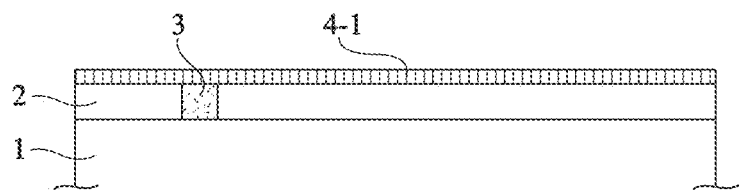
FIGS. 5A to 5E illustrate successive steps of a third embodiment of a method of simultaneously manufacturing interconnection levels and levels of an infrared filter of an image sensor.

As illustrated in FIG. 5A, it is started from a structure identical to that previously described in relation with FIG. 3A.

Figure 5B:
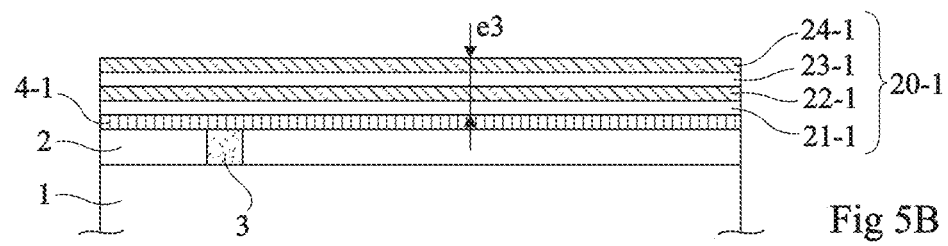

At the step of FIG. 5B, instead of depositing a single amorphous silicon layer (α-Si) as in the case of FIGS. 3C and 4B, an alternation 20-1 of layers of SiO2 and of α-Si has been deposited on etch stop layer 4-1. This alternation 20-1 of layers comprises, in the shown example, a SiO2 layer 21-1, a α-Si layer 22-1, another SiO2 layer 23-1, and another α-Si layer 24-1. Alternation 20-1 of layers has a total thickness e3.

Figure 5C:
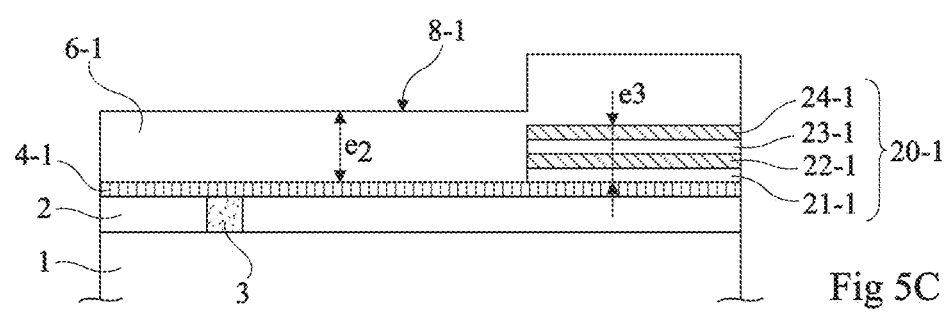

At the step of FIG. 5C, the following succession of steps has been carried out:

removing the alternation of layers 20-1 on the left-hand side; and depositing a layer 6-1 of SiO2 having a thickness e2 greater than thickness e3. Reference 8-1 designates the upper surface of layer 6-1, where layer 6-1 does not cover the alternation of layers 20-1.

Figure 5D:
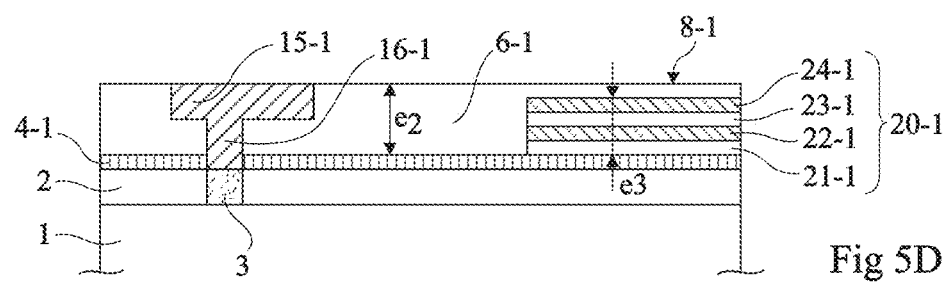

At the step of FIG. 5D, the following succession of steps has been carried out: etching in layer 6-1 of SiO2, on the left-hand side, a first recess having a depth smaller than thickness e2;

etching, inside of the first recess and vertically above connection 3, a second recess in layer 6-1, narrower than the first recess, all the way to etch stop layer 4-1;

removing the portion of etch stop layer 4-1 located at the bottom of the second recess;

depositing a metal layer forming, in the recesses, a conductive track 15-1 and a via 16-1 connecting track 15-1 to connection 3; and planarizing the structure at the level of surface 8-1.

Figure 5E:
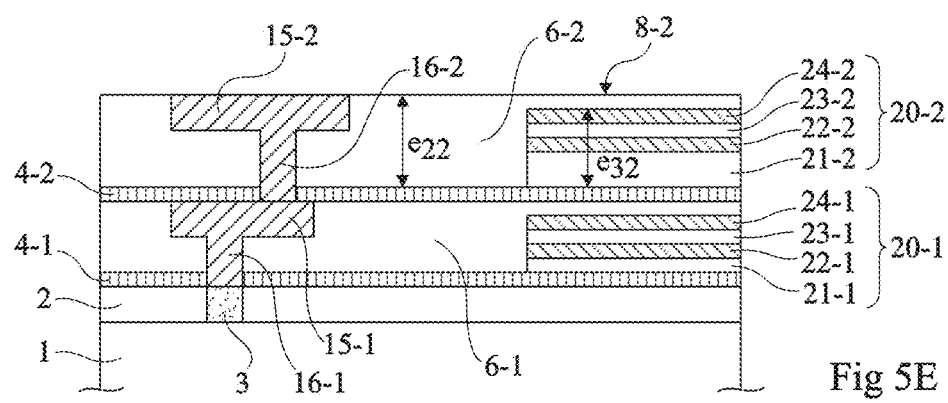

At the step of FIG. 5E, the succession of steps of FIGS. 5A to 5D has been repeated on the structure of FIG. 5D. Thus, the following succession of steps has been carried out:

depositing an etch stop layer 4-2 on layer 6-1;

depositing an alternation of layers 20-2 of SiO2 and of α-Si on etch stop layer 4-2. This alternation of layers 20-1 comprises, in the shown example, a SiO2 layer 21-1, a α-Si layer 22-1, another SiO$_2$ layer 23-1, and another α-Si layer 24-1. The alternation of layers 20-1 has a total thickness e32;

removing the alternation of layers 20-2 on the left-hand side;

depositing a layer 6-2 of SiO2 having a thickness e22 greater than thickness e32. Reference 8-2 designates the upper surface of layer 6-2, where layer 6-2 does not cover the alternation of layers 20-2;

etching in layer 6-2 of SiO2, on the left-hand side, a first recess having a depth smaller than thickness e32;

etching a narrower second recess in layer 6-2, located inside of the first recess, all the way to etch stop layer 4-2;

removing the portion of etch stop layer 4-2 located at the bottom of the second recess;

depositing a metal layer forming, in the recesses, a conductive track 15-2 and a via 16-2 connecting track 15-2 to track 15-1; and planarizing the structure at the level of surface 8-2.

A stack of two interconnection levels on the left-hand side of the drawing and a stack of a plurality of infrared filter levels on the right-hand side of the drawing have thus been formed by using common steps.

As in the case of FIGS. 3A to 3J and 4A to 4E, if more than two interconnection levels are provided, the process will be repeated and the number of alternated amorphous silicon, SiO2 and etch stop layers will be increased. Simulation software is used to determine the thicknesses of the alternated amorphous silicon and SiO2 layers, according to the thickness of the SiO2 and etch stop layers imposed by the forming of the interconnection levels, to form infrared filters having the desired properties.

In the previously-described embodiments, the depositions of the different layers should be performed at a temperature lower than or equal to 400° C. to avoid damaging the layers forming the interconnections already present. The metal, silicon oxide, and amorphous silicon layers are for example formed by physical vapor deposition (PVD). As a variation, the silicon oxide and amorphous silicon layers may be deposited by plasma-enhanced chemical vapor deposition (PECVD). In this case, the deposition temperature of these two materials alternately stacked in the filter should be identical and greater than 350° C. to give a mechanical, morphological and thermal stability to the stacks. This deposition method is advantageous in the context of a process comprising a final anneal at approximately 400° C.

Indeed, the inventors have observed a tendency to delamination at certain α-Si and SiO2 interfaces after anneal at 400° C., for filter levels deposited at a temperature lower than 350° C. by PECVD.

In the previously-described embodiments, thicknesses e2, e22 of the SiO2 layers have values substantially in the range from 150 nm to 650 nm Thicknesses e1, e12, (or e3, e32) of the amorphous silicon layers (or of the alternations of α-Si and SiO2 layers) have values substantially in the range from 50 nm to 200 nm. The etch stop layers have values substantially in the range from 20 nm to 50 nm.

The total thickness of a stack of layers deposited according to an embodiment of the previously-described method is substantially in the range from 0.5 μm to 10 μm, preferably from 1 μm to 3 μm.

Figure 6A:
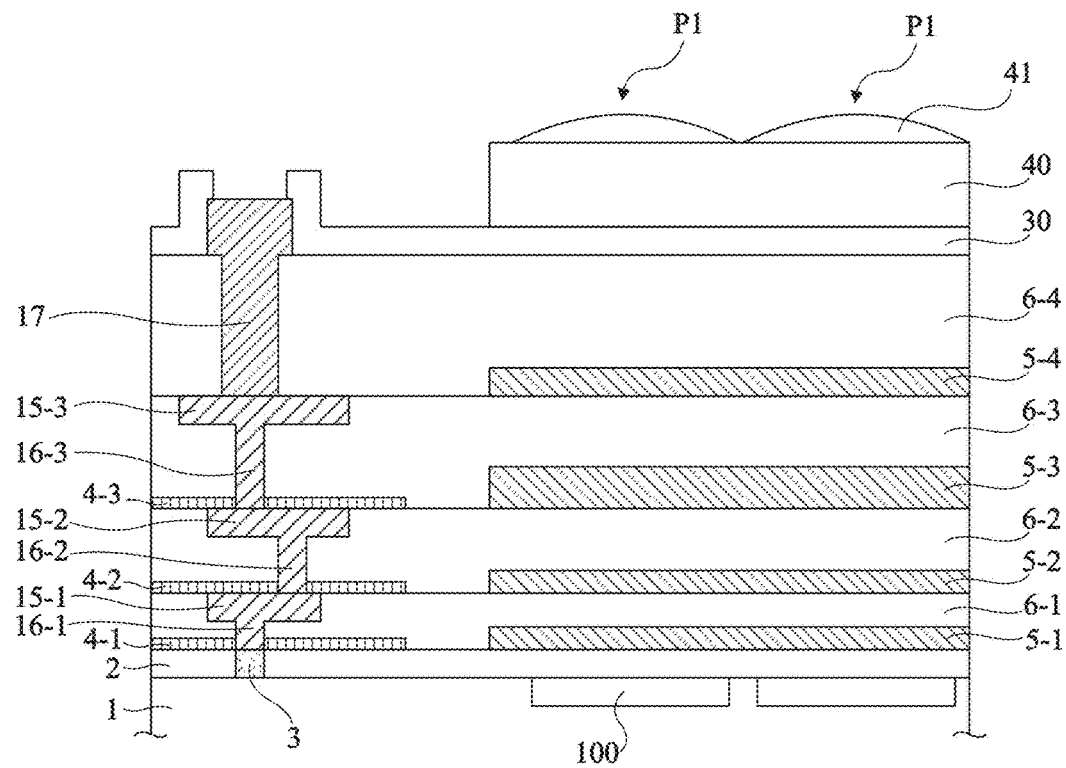
FIG. 6A illustrates a cross-section view of an embodiment of an image sensor.

FIG. 6A is a cross-section view of an image sensor formed on a semiconductor substrate 1 comprising photodetection areas 100. The substrate is coated with a layer 2 of SiO2 where a connection 3 with an element of semiconductor substrate 1 or a MOS transistor gate has been prepared. A stack of interconnection levels is shown on the left-hand side of the drawing and a stack of filter levels is shown on the right-hand side of the drawing. These stacks are formed according to a method corresponding to the first embodiment described in relation with FIGS. 3A to 3J.

The left-hand side of FIG. 6A corresponds to a stack of four interconnection levels similar to the interconnection levels shown on the left-hand side of FIG. 3J. This stack of levels comprises conductive tracks 15-1, 15-2, 15-3 separated from one another by insulating layers 6-1, 6-2, 6-3, 6-4 and interconnected by vias 16-1, 16-2, 16-3 crossing the insulating layers. As an example of embodiment, the last interconnection level comprises a connection pad 17 protruding from the surface of the upper portion of the image sensor. Such an interconnection configuration has been shown as an example only. Various configurations of interconnection levels are possible.

The right-hand side of the drawing corresponds to two pixels dedicated to infrared P1. This side comprises a stack of four filter levels similar to the filter levels shown on the right-hand side of FIG. 3J. This stack of levels comprises an alternation of insulating layers 2, 6-1, 6-2, 6-3, 6-4 and of amorphous silicon layers 5-1, 5-2, 5-3, 5-4 forming an infrared filter.

Conventionally, at least one passivation layer 30 is deposited at the surface of the interconnection and filter levels. Layer 30 is open opposite pad 17. A final anneal, for example, for 2 hours at 400° C. in a N2H2 atmosphere, may be carried out after the deposition of layer 30.

A resin layer 40 substantially opaque for visible light and transparent to infrared, currently called "black resin" has been deposited at the surface of passivation layer 30 on the right-hand side of the drawing, above the stack of filter levels. A microlens 41 is arranged on resin layer 40, vertically above each photodetection area 100. Each pixel P1 comprises a photodetection area, an infrared filter, a black resin, and a microlens.

Figure 6B:
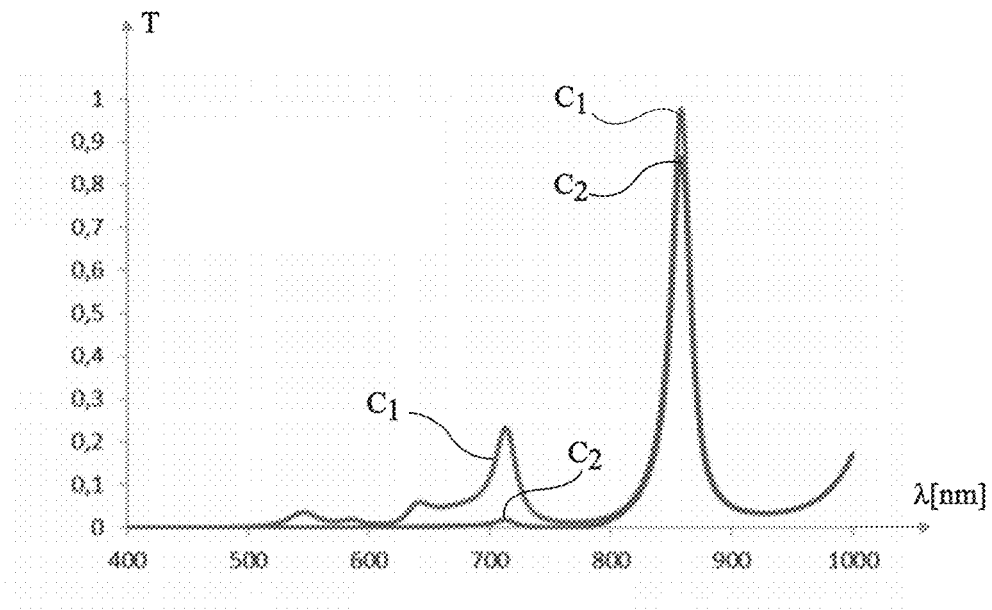
FIG. 6B is a diagram showing the transmission of the infrared filter shown in FIG. 6A in different configurations.

FIG. 6B is a diagram showing transmission T of the filter of FIG. 6A, according to wavelength λ. Curve C1 corresponds to the transmission of the filter with no black resin 40 and curve C2 corresponds to the transmission of the filter in the presence of a black resin layer 40. Black resin 40 enables to suppress the parasitic transmission of the filter in the visible range. These curves correspond to the case where the thicknesses of the deposited layers are the following:

| layer | | -1 | -1 | -2 | -2 | -3 | -3 | -4 | -4 |
|---|---|---|---|---|---|---|---|---|---|
| thickness (nm) | 90 | 0 | 00 | 0 | 30 | 80 | 30 | 0 | 70 |

In this configuration, the transmission peak is at a wavelength of substantially 850 nm and is greater than 80%. The width at half maximum of this peak is substantially 25 nm Such performances are compatible with the use of the image sensor as a distance sensor implementing a time-of-flight measurement or TOF method where the width at half maximum of the peak should be generally in the range from 20 nm to 50 nm and the transmission maximum should be greater than 80%.

Figure 7:
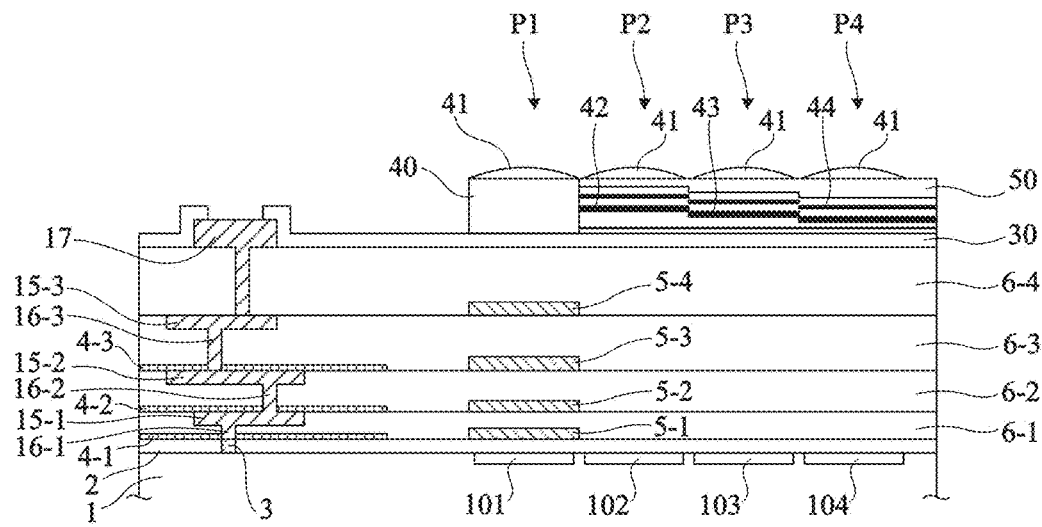
FIGS. 7 to 9 show cross-section views of other embodiments of an image sensor.

FIG. 7 is a cross-section view of an image sensor formed on a semiconductor substrate 1 comprising photodetection areas 101, 102, 103, and 104.

The left-hand side of the drawing, comprising interconnection levels and a pixel P1 provided with an infrared filter, is identical to the representation of FIG. 6A (for a single pixel P1). The common elements are designated with the same reference numerals and will not be detailed again herein.

The right-hand portion of the drawings shows pixels P2, P3, P4, dedicated to the visible range, each being provided with a visible light filter 42, 43, 44 arranged vertically above photodetection areas 102, 103, and 104. The three filters 42, 43, 44 respectively filter the red, green, and blue colors (RGB). These filters are for example of the type illustrated in FIG. 4B of US patent application No 2012/0085944 of the applicant and comprising an alternation of metal layers sufficiently thin to be transparent and of dielectric layers. The dielectric layers are selected to be transparent to the selected colors (RGB).

A planarization layer 50 places at a single level the surface above the three filters 42, 43, 44 and black resin layer 40. For each of pixels P1, P2, P3, and P4, a microlens 41 is arranged on the planar surface formed by layer 50. According to an embodiment, black resin layer 40 may be formed after the forming of filters 42, 43, 44 and of planarization layer 50.

Figure 8:
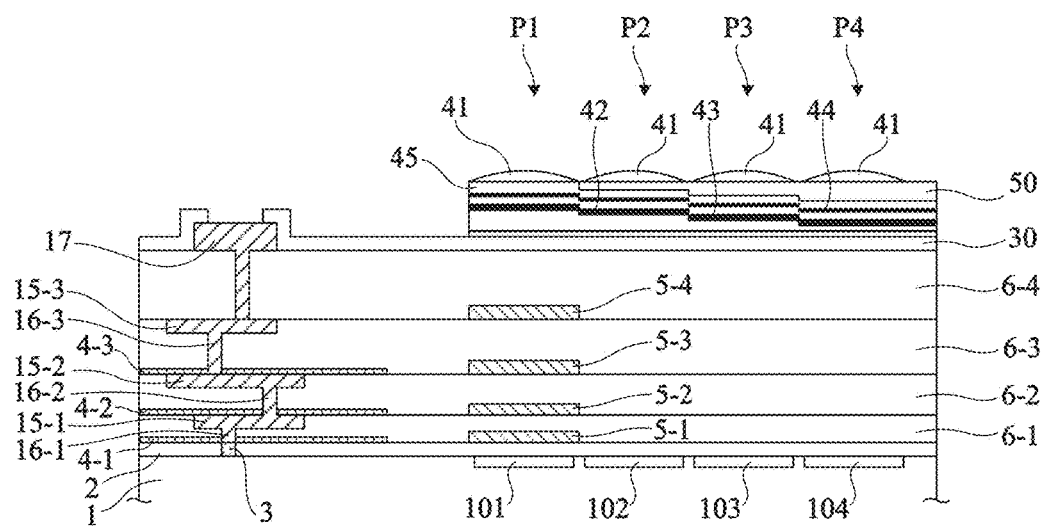

FIG. 8 illustrates an alternative embodiment of an image sensor similar to that of FIG. 7, comprising interconnection levels, one pixel dedicated to infrared and three pixels dedicated to the visible range. The elements common to FIGS. 8 and 7 are designated with the same reference numerals and will not be detailed again herein. In FIG. 8, black resin layer 40 of FIG. 7 has been replaced with an infrared filter 45 formed by an alternation of metal and dielectric layers in the same way as filters 42, 43, and 44 of FIG. 7. Advantageously, filter 45 may be formed at least partly simultaneously with filters 42, 43, and 44. Infrared filter 45 cannot perform a filtering alone on a reduced frequency range, which is necessary for the use of the image sensor as a TOF-type distance sensor. Indeed, filter 45 cannot comprise a large number of insulating and metal layers due to the fact that the absorption rate of the metal layers may be large and that the thicknesses of filters 42, 43, 44, and 45 should be equal. This is why infrared filter 45 should be associated with the infrared filer corresponding to the stack of amorphous layers 5-1, 5-2, 5-3, and 5-4 and of silicon oxide layers 6-1, 6-2, 6-3, and 6-4.

According to another embodiment, filter 45 is replaced with an infrared filter comprising an alternation of SiO2 layers and of amorphous Si layers. This advantageously enables to increase the transmission of the infrared filter formed on passivation layer 30. Preferably, each filter 42, 43, and 44 comprises amorphous silicon layers in addition to the insulating layers and to the metal layers, and the infrared filter may be formed at least partly simultaneously with filters 42, 43, and 44, the metal layers being etched above infrared pixel P1 after each deposition.

Figure 9:
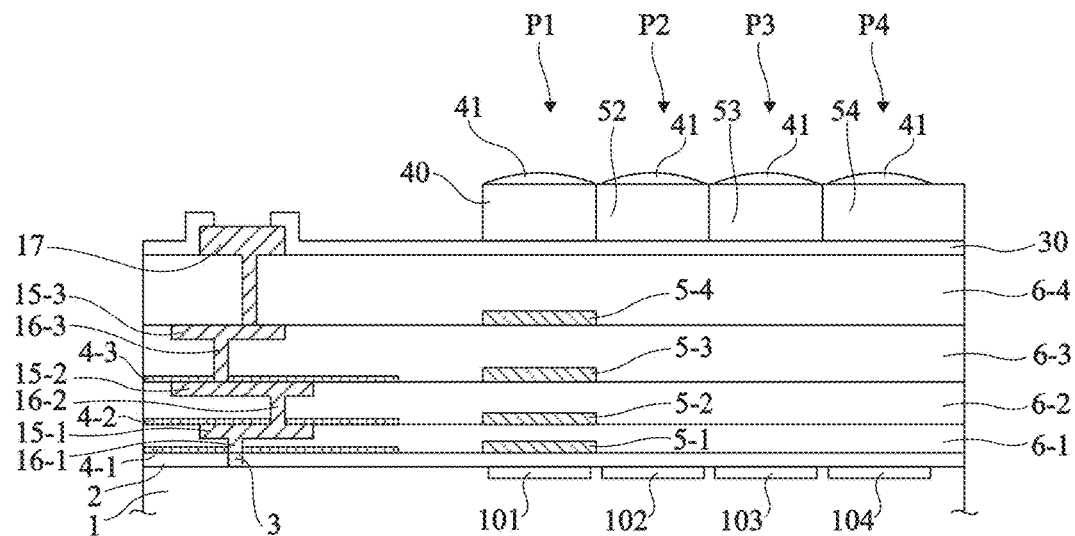

FIG. 9 illustrates another embodiment of an image sensor similar to that of FIG. 7. The elements common with FIGS. 9 and 7 are designated with the same references and will not be detailed again herein. In FIG. 9, the filters formed by an alternation of metal and dielectric layers 42, 43, 44 of FIG. 7 have been replaced with resins 52, 53, and 54 respectively red, green and blue.

An image sensor similar to the embodiments of FIG. 7, 8, or 9 may be provided, where the layers (40 or 45) deposited at the surface of passivation layer 30 and opposite the infrared bandpass filter are replaced with an alternation of amorphous silicon layers, of silicon oxide layers and, according to an embodiment, of etch stop layers. This alternation forms at least one filter level similar to the filter levels manufactured according to an embodiment of the previously-described method which collaborates with the filter levels to form the infrared bandpass filter.

Image sensors comprising a semiconductor substrate having a surface, called front surface, coated with an interconnection structure and intended to receive an illumination, has been described up to now.

Image sensors comprising a semiconductor substrate having a first surface, called front surface, and having a second surface, called rear surface, intended to receive an illumination, coated with an interconnection structure, are also known. This type of structure is currently used in the art for image sensors in the visible range. However, the photodetection areas dedicated to infrared need a significant semiconductor thickness which is little compatible with the forming of back-side illuminated sensors.

Figure 10:
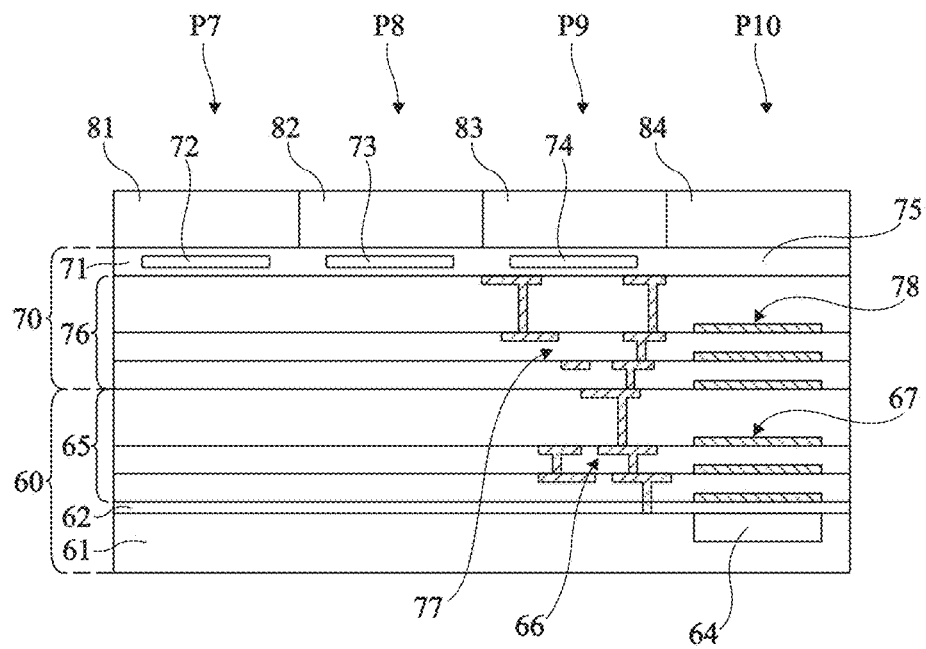
FIG. 10 shows a possible application of an embodiment of an image sensor intended to be illuminated on its rear surface or back side.

FIG. 10 illustrates the association of a back-side illuminated visible light sensor and of a front-side illuminated infrared sensor. For the infrared sensor, the interconnection and filter levels are manufactured according to an embodiment of the previously-described method.

A first wafer 60 comprises a semiconductor substrate 61 coated with a SiO2 layer 62 and comprising a photodetection area 64 dedicated to infrared. A first interconnection structure 65 has been manufactured according to an embodiment of the previously-described method, comprising interconnection levels 66 and first infrared filter levels 67. Infrared filter levels 67 are arranged opposite photodetection area 64.

A second wafer 70 comprises a thinned semiconductor substrate 71 comprising photodetection areas 72, 73, 74 dedicated to the visible range and configured for a back-side illumination, as well as a transparent free space 75. According to an embodiment, free space 75 advantageously corresponds to an area of semiconductor substrate 71. Second wafer 70 comprises a second interconnection structure 76 placed, for example by molecular bonding, against the first interconnection structure 65. Second structure 76 is manufactured according to an embodiment of the previously-described method and comprises interconnection levels 77 and second infrared filter levels 78. This structure is arranged on the lower surface side of thinned semiconductor substrate 74. Each photodetection area is coated with a color filter 81, 82, 83, forming pixels P7, P8, P9 dedicated to the visible range. Free space 75 is located opposite second filter levels 78 and is coated with a black resin layer 84. Second filter levels 78 are aligned and cooperate with the first infrared filter levels 67 to form a single infrared bandpass filter. The alignment of free space 75, of black resin 84, and of filter levels 67, 78 of the two structures placed against each other with photodetection area 64 forms a pixel P10 dedicated to infrared. Pixel P10 is similar to the pixels dedicated to infrared of the previously-discussed embodiments. As a variation, black resin layer 84 is not present. In this case, semiconductor substrate 71 may be thicker at the level of area 75 to form a planar surface with color filters 81, 82, and 83. This advantageously enables to increase the absorption of the visible spectrum at the level of pixel P10. In the present embodiment, an infrared filter level 67, 78 is formed in each wafer 60, 70. As a variation, an infrared filter level may be formed in one of wafers 60 or 70 only. This enables to decrease the number of steps of the sensor manufacturing method. However, the obtained spectral response of the infrared filter may then be less favorable than that obtained with the two infrared filter levels 67, 78.

This association thus forms an image sensor comprising pixels P7, P8, P9 dedicated to the visible range intended to be illuminated on its back side and a pixel P10 dedicated to infrared intended to be illuminated on its front side. In practice, configurations of this type are periodically repeated and form a pixel array of an image sensor.

Figure 11:
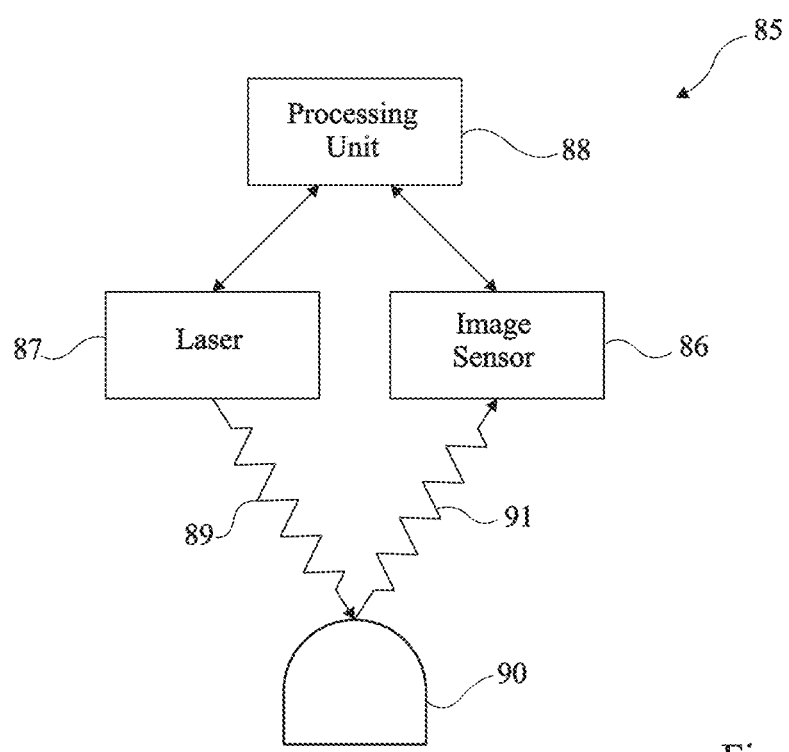
FIG. 11 partially and schematically shows an embodiment of a distance measurement system.

FIG. 11 shows a distance measurement system 85 comprising an image sensor 86 (Image Sensor), such as previously described, a projector 87 (Laser), for example, a laser source, and a processing unit 88 (Processing Unit) connected to laser source 87 and to image sensor 86. Processing unit 88 may comprise a processor capable of executing a computer program stored in a memory. The operating principle of system 85 is the following. Laser source 87 emits a radiation 89 at the wavelength of the infrared filter of image sensor 86. Incident radiation 89 is reflected on an object 90. Image sensor 86 detects reflected radiation 91. According to an embodiment, processing unit 88 is capable of determining the time taken by the radiation to travel from object 90 to image sensor 86. Such a time-of-flight measurement may be performed independently by each pixel of the image sensor, thus enabling to obtain a full three-dimensional image of object 90. According to another embodiment, laser source 87 is capable of projecting a pattern or a plurality of patterns on the object and image sensor 86 is capable of acquiring images of object 90 having the patterns projected thereon. Processing unit 88 is capable, based on an analysis of the acquired images, of determining a three-dimensional image of object 90.

Specific embodiments have been described. Various alterations, modifications, and improvements will occur to those skilled in the art. In particular, the embodiments shown in FIGS. 7, 8, and 9 may be manufactured according to the second embodiment of the method previously described in relation with FIGS. 4A to 4E, according to the third embodiment of the method previously described in relation with FIGS. 5A to 5E, or also according to a combination of the first, second, and third previously-described embodiments of the method.

Although amorphous silicon depositions to manufacture the infrared filter have been described, it should be understood that one may deposit polysilicon layers instead of amorphous silicon.

An antireflection layer formed of a SiO2 layer and of a SiN layer may also be deposited between semiconductor substrate 1 and layer 2 of SiO2. The thicknesses of these layers may be, for example substantially 25 nm for SiO2 and substantially 50 nm for SiN.

In the embodiments discussed in FIGS. 6, 7, 8, 9, and 10, it should be understood that the pixels formed by the photodetection areas and the associated filters may form an array of pixels according to a periodic repetition of a given pattern, such as, for example, a Bayer array.

It should be understood that the interconnections are associated with the photodetection areas of the substrates, and that connections 17 may be arranged at the surface around the pixel array.

It will be within the abilities of those skilled in the art to combine various elements of the various embodiments and variations described hereabove without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of simultaneously forming an infrared bandpass filter on a filter side and interconnection levels on an interconnect side of an image sensor, comprising the steps of:
    a) forming a first layer of a dielectric material having a refraction index smaller than 2.5 at the maximum transmission wavelength of the filter on a semiconductor substrate;
    b) depositing an etch stop layer;
    c) depositing at least one silicon layer having a first thickness;
    d) removing, on the interconnect side, said at least one silicon layer;
    e) depositing a second layer of the dielectric material having a second thickness greater than the first thickness;
    f) forming in the second layer metal tracks and interconnection vias, on the interconnect side;
    g) planarizing the surface to a level corresponding to the level of the surface of the second layer, where the second layer does not cover said at least one silicon layer; and
    h) repeating steps b) to g) at least once, the values of the first and second thicknesses being selected from one repetition to another, according to calculations implying a simulation step and/or according to the desired electric performances.

2. The method of claim 1, wherein the silicon is amorphous silicon.

3. The method of claim 1, wherein the dielectric material is silicon oxide.

4. The method of claim 1, wherein the first and second layers and the silicon layer are deposited at a temperature in the range from 350° C. to 400° C.

5. The method of claim 1, wherein the first and second layers and the silicon layer are deposited at the same temperature.

6. The method of claim 1, further comprising the step of removing the etch stop layer on the filter side before proceeding to step c).

7. The method of claim 1, wherein said at least one silicon layer comprises an alternation of amorphous silicon layers and of silicon oxide layers.

8. The method of claim 1, wherein the etch stop layer is made of silicon nitride, of SiCH, or of SiOCH.

9. The method of claim 1, further comprising the forming, before step b), of an electric connection with an element of the semiconductor substrate or with a gate of a field-effect transistor formed on the semiconductor substrate.

10. An image sensor having a portion comprising:
    interconnection levels formed on a semiconductor substrate covered with a first layer of a dielectric material comprising conductive tracks separated from one another by insulating layers and interconnected by vias crossing the insulating layers; and
    an infrared bandpass filter comprising filter levels adjacent to the interconnection levels formed by an alternation of second layers of the dielectric material and of silicon layers, the refraction index of the dielectric material being smaller than 2.5 at the maximum transmission wavelength of the filter, one of the second dielectric layers of each filter level being identical to the insulating layer of the adjacent interconnection level.

11. The image sensor of claim 10, comprising, at the surface of said portion of the image sensor and opposite the infrared bandpass filter, an alternation of third layers of materials having different optical indexes, adding at least one filter level to the infrared bandpass filter.

12. The image sensor of claim 10, further comprising at least one optical filter formed by a resin layer opaque to the wavelengths of the visible range and transparent to infrared wavelengths, arranged at the surface of said portion and opposite the infrared bandpass filter.

13. The image sensor of claim 10, comprising at least one optical filter, formed by an alternation of at least partially transparent metal layers and of fourth dielectric layers, arranged at the surface of said portion of the image sensor and opposite the infrared bandpass filter.

14. The image sensor of claim 10, further comprising areas dedicated to the visible range comprising color filters arranged at the surface of said portion of the image sensor.

15. The image sensor of claim 14, wherein the color filters are formed of an alternation of at least partially transparent metal layers and of fifth dielectric layers.

16. The image sensor of claim 14, wherein the color filters are colored resins.

17. The image sensor of claim 10, comprising first and second wafers, each having a front surface and a rear surface, the first wafer comprising on its rear surface side a first semiconductor substrate having a first photodetection area sensitive to infrared radiation;
    the second wafer comprising on its rear surface side a second semiconductor substrate having a second area comprising pixels sensitive to radiation in the visible range and having a third area transparent to radiation in the infrared range, at least one of the first wafer or of the second wafer comprising on its front surface side a structure comprising the interconnection levels and the filter levels; and
    the front surface of the first wafer being placed against the front surface of the second wafer, to align with the first area the third area, the filter levels, the alignment of said filter levels forming an infrared bandpass filter.

18. A system comprising:
    a laser source intended to project an infrared radiation on at least one object; and
    the image sensor of claim 10, capable of detecting the radiation reflected by the object.

* * * * *

UNITED STATES PATENT AND TRADEMARK OFFICE
CERTIFICATE OF CORRECTION

PATENT NO. : 9,871,074 B2
APPLICATION NO. : 15/163557
DATED : January 16, 2018
INVENTOR(S) : Laurent Frey et al.

It is certified that error appears in the above-identified patent and that said Letters Patent is hereby corrected as shown below:

In the Claims
At Column 13, Line 19 delete the word "infrared".

Signed and Sealed this
Seventeenth Day of April, 2018

Andrei Iancu
*Director of the United States Patent and Trademark Office*